United States Patent
Lee

(10) Patent No.: US 11,445,620 B2
(45) Date of Patent: Sep. 13, 2022

(54) METHOD OF MAKING PRINTED CIRCUIT BOARD STRUCTURE INCLUDING A CLOSED CAVITY WITH VIAS

(71) Applicant: Skyworks Solutions, Inc., Irvine, CA (US)

(72) Inventor: Ki Wook Lee, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/230,584

(22) Filed: Apr. 14, 2021

(65) Prior Publication Data

US 2021/0315110 A1 Oct. 7, 2021

Related U.S. Application Data

(62) Division of application No. 15/967,955, filed on May 1, 2018, now Pat. No. 10,986,739.

(Continued)

(51) Int. Cl.
*H01Q 13/00* (2006.01)
*H05K 3/46* (2006.01)
(Continued)

(52) U.S. Cl.
CPC ............. *H05K 3/4697* (2013.01); *H01Q 1/38* (2013.01); *H05K 1/165* (2013.01); *H05K 3/4623* (2013.01);
(Continued)

(58) Field of Classification Search
CPC .... H01L 21/4857; H01Q 1/38; H01Q 9/0407; H01Q 1/2283; H01Q 1/242; H01Q 1/36; H05K 3/0047; H05K 3/4697; H05K 1/115; H05K 2203/1178; H05K 3/42; H05K 3/429; H05K 3/4611; H05K 3/4623; Y10T 29/49117; Y10T 29/49155;
(Continued)

(56) References Cited

U.S. PATENT DOCUMENTS

| 5,804,422 | A | 9/1998 | Shimizu et al. |
| 8,143,533 | B2 * | 3/2012 | Kaneda ................... H05K 3/426 174/262 |

(Continued)

FOREIGN PATENT DOCUMENTS

| CN | 107069208 | 8/2017 |
| CN | 206774674 | 12/2017 |

OTHER PUBLICATIONS

Suga, et al., *Cost-Effective 60-GHz Antenna Package With End-Fire Radiation for Wireless File-Transfer System*, IEEE Transactions on Microwave Theory and Techniques, vol. 58, No. 12, Dec. 2010, 7 pp.

*Primary Examiner* — Thiem D Phan
(74) *Attorney, Agent, or Firm* — Knobbe, Martens, Olson & Bear, LLP

(57) ABSTRACT

A method of making a printed circuit board structure including a closed cavity is provided. The method can include the steps of forming a cavity in a core structure of a core layer, laminating each of a top surface and a bottom surface of the core structure with an adhesive layer and a metal layer to prepare a laminate structure and cover the cavity to define a closed cavity. The method also includes forming vias through the laminate structure, and patterning the metal layers in the laminate structure.

20 Claims, 9 Drawing Sheets

Related U.S. Application Data

(60) Provisional application No. 62/502,499, filed on May 5, 2017.

(51) Int. Cl.
- *H01Q 1/38* (2006.01)
- *H05K 1/16* (2006.01)
- *H05K 3/00* (2006.01)
- *H01Q 9/04* (2006.01)
- *H05K 3/06* (2006.01)
- *H05K 3/40* (2006.01)
- *H05K 3/42* (2006.01)

(52) U.S. Cl.
CPC ......... *H05K 3/4655* (2013.01); *H01Q 9/0407* (2013.01); *H05K 3/005* (2013.01); *H05K 3/0026* (2013.01); *H05K 3/0047* (2013.01); *H05K 3/06* (2013.01); *H05K 3/4038* (2013.01); *H05K 3/429* (2013.01); *H05K 2201/10098* (2013.01); *Y10T 29/49016* (2015.01)

(58) Field of Classification Search
CPC ....... Y10T 29/49165; Y10T 428/24917; Y10T 29/49016
USPC ............................ 29/600, 825, 829, 846, 852
See application file for complete search history.

(56) References Cited

U.S. PATENT DOCUMENTS

| | | |
|---|---|---|
| 8,400,776 B2 | 3/2013 | Sahara et al. |
| 8,760,352 B2 | 6/2014 | Rao et al. |
| 9,819,098 B2 | 11/2017 | Gu et al. |
| 10,418,707 B2 | 9/2019 | Malekzadeh et al. |
| 10,431,892 B2 * | 10/2019 | Garcia .................... H01L 23/66 |
| 10,541,474 B2 | 1/2020 | Malekzadeh et al. |
| 10,700,424 B2 | 6/2020 | Lee |
| 10,847,888 B2 | 11/2020 | Malekzadeh et al. |
| 10,986,739 B2 | 4/2021 | Lee |
| 2007/0290941 A1 | 12/2007 | Brown |
| 2010/0327068 A1 | 12/2010 | Chen et al. |
| 2014/0285289 A1 | 9/2014 | Herbsommer et al. |
| 2016/0056544 A1 | 2/2016 | Garcia et al. |
| 2016/0164186 A1 | 6/2016 | Ganchrow et al. |
| 2018/0324960 A1 | 11/2018 | Lee |
| 2020/0395659 A1 | 12/2020 | Lee |

\* cited by examiner

METHOD OF MAKING PRINTED CIRCUIT BOARD STRUCTURE INCLUDING A CLOSED CAVITY WITH VIAS

CROSS-REFERENCE TO RELATED APPLICATIONS

Any and all applications for which a foreign or domestic priority claim is identified in the Application Data Sheet as filed with the present application are hereby incorporated by reference under 37 CFR 1.57, and should be considered a part of this specification.

BACKGROUND

Field

Embodiments of the invention relate to electronic systems, and in particular, to methods of making printed circuit boards for radio-frequency (RF) electronics.

Description of the Related Art

Printed circuit board (PCB) structures are commonly used in electronics. Some printed circuit board structures include exposed cavities.

SUMMARY

Accordingly, there is a need for an improved printed circuit board structure that includes an enclosed cavity, such as an air cavity, and a method for manufacturing it. In one aspect, the cavity can function as an antenna.

In accordance with one aspect, a closed cavity printed circuit board is provided. The closed cavity printed circuit board comprises a substrate layer, a first metal layer disposed over the substrate layer, a core layer disposed over the first metal layer, and a second metal layer disposed over the core layer. The core layer defines a closed cavity between the first and second metal layers.

In accordance with another aspect, a radiofrequency module is provided. The radiofrequency module comprises a printed circuit board including a substrate layer, a first metal layer disposed over the substrate layer, a core layer disposed over the first metal layer and defining a closed cavity, a second metal layer disposed over the core layer, a second core layer disposed over the second metal layer and a third metal layer disposed over the second core layer, the third metal layer forming a planar antenna.

In accordance with another aspect, a wireless mobile device is provided. The wireless mobile device comprises an antenna defined by a printed circuit board including a substrate layer, a first metal layer disposed over the substrate layer, a core layer disposed over the first metal layer and defining a closed cavity, a second metal layer disposed over the core layer, a second core layer disposed over the second metal layer, and a third metal layer disposed over the second core layer, the cavity defining the antenna and configured to radiate in a first direction. The wireless mobile device also comprises a planar antenna defined by the third metal layer and spaced apart from the cavity and configured to radiate in a second direction different than the first direction, and a transceiver configured to process signals received by the antenna.

In accordance with another aspect, a method of making a closed cavity printed circuit board is provided. The method comprises forming a cavity in a core structure of a core layer, laminating each of a top surface and a bottom surface of the core structure with an adhesive layer and a metal layer to prepare a laminate structure and cover the cavity to define a closed cavity. The method also comprises forming vias through the laminate structure, and patterning the metal layers in the laminate structure.

In accordance with another aspect, a method of making a closed cavity printed circuit board is provided. The method comprises providing a core layer having a core structure between a pair of metal layers, removing the pair of metal layers from the core layer, forming a cavity in the core structure, and laminating the core structure with an adhesive layer and metal layers over a top and bottom surface of the core structure to prepare a laminate structure and cover the cavity and define a closed cavity. The method also comprises forming vias through the laminate structure, patterning the metal layers in the laminate structure, and attaching the patterned laminate structure to a substrate.

In accordance with another aspect, a method of making a printed circuit board is provided. The method comprises providing a printed circuit board structure having an open cavity defined in a core layer, laying a cover layer over the printed circuit board structure so that the cover layer extends over the cavity to cover the cavity and define a closed cavity, laminating a board over the cover layer, the board having at least two layers, and forming one or more through bores through the cover layer. The method also comprises plating the one or more through bores to form one or more vias between a top metal layer of the board and a bottom metal layer of the board.

DETAILED DESCRIPTION

Figure 1:
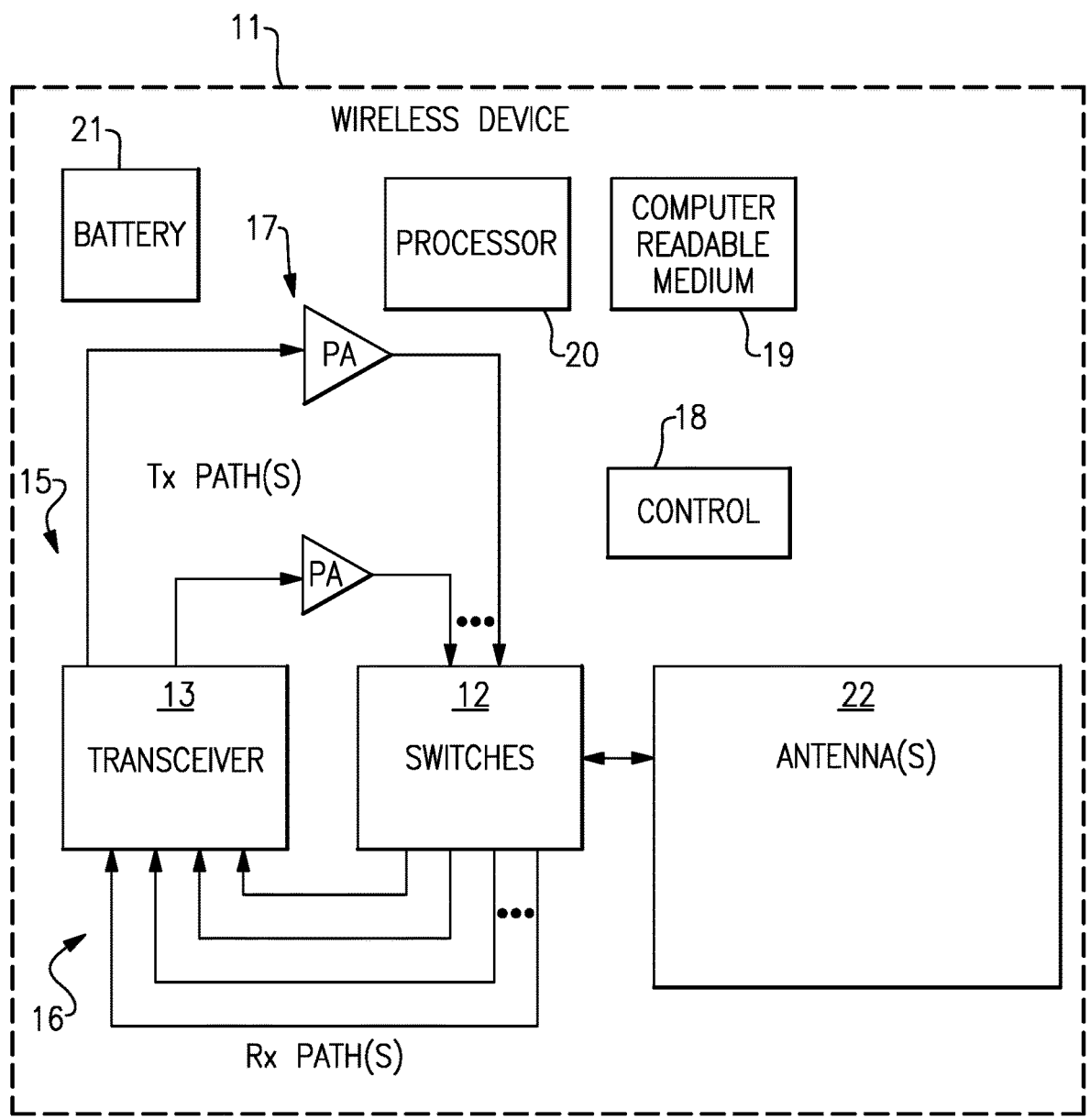
FIG. 1 is a schematic block diagram of one example of a wireless device that can include one or more closed-cavity antennas.

The headings provided herein, if any, are for convenience only and do not necessarily affect the scope or meaning of the claimed invention.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a figure and/or a subset of the elements illustrated in a figure. Further, some embodiments can incorporate any suitable combination of features from two or more figures.

There is a desire for an improved packaging technology. The package can include a laminated substrate with an antenna. An electronic component or die, such as a radio frequency (RF) component, can be disposed along a bottom layer of the laminate substrate. Solder bumps can be disposed around the electronic component and electrically connected to the ground plane. The solder bumps can attach the module to a carrier or directly to a system board. The electronic component can be surrounded by solder bumps. For example, outside edges of the electronic component can have ground solder bumps that are connected to the ground plane by way of vias. The ground solder bumps around the electronic component can be connected to ground of a carrier or system board.

One aspect of this disclosure is a module that includes a multi-layer substrate, an antenna, a radio frequency (RF) component, and conductive features disposed around the RF component. The multi-layer substrate has a first side and a second side opposite to the first side. The multi-layer substrate includes a ground plane. The antenna is on the first side of the multi-layer substrate. The RF component is on the second side of the multi-layer substrate such that the ground plane is positioned between the antenna and the RF component. The conductive features are disposed around the RF component and electrically connected to the ground plane. The conductive features and the ground plane configured to provide shielding for the RF component.

Another aspect of this disclosure is an RF circuit assembly that includes a laminate substrate having a first side and a second side opposite the first side, an antenna on the first side of the laminate substrate, an RF component attached on the second side of the laminate substrate, and a plurality of solder bumps disposed around the RF component. The laminate substrate includes a ground plane that is positioned between the antenna and the RF component. The solder bumps form at least a portion of an electrical connection to the ground plane to thereby form at least a portion of a shielding structure around the RF component.

Another aspect of this disclosure is system board assembly that includes a laminate substrate having a first side and a second side opposite to the first side, an antenna on the first side of the laminate substrate, an RF component attached on the second side of the laminate substrate, a plurality of solder bumps disposed around the RF component, and a system board. The laminate substrate includes at least one layer forming a ground plane. The ground plane is positioned between the antenna and the RF component. The plurality of solder bumps are electrically connected to the ground plane. The system board can include ground pads electrically connected to ground plane by way of the plurality of solder bumps such that a shielding structure is formed around the RF component.

Overview of Wireless Devices

FIG. 1 is a schematic block diagram of one example of a wireless or mobile device 11. The wireless device 11 can include one or more antennas implementing one or more features of the present disclosure, such as one or more closed cavity antennas.

Closed-cavity antennas can be used within the wireless or a mobile device 11 implementing a 5G telecommunication standard that may utilize 30 GHz and 60-70 GHz frequency bands. Additionally, the 3G, 4G, LTE, or Advanced LTE telecommunication standards can be used in the wireless or mobile device 11, as described herein.

The example wireless device 11 depicted in FIG. 1 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

In certain embodiments, the wireless device 11 can include an antenna switch module 12, a transceiver 13, at least one antenna package 22, power amplifiers 17, a control component 18, a computer readable medium 19, a processor 20, and a battery 21.

The transceiver 13 can generate RF signals for transmission via the antenna 22. Furthermore, the transceiver 13 can receive incoming RF signals from the antenna 22. The at least one antenna package 22 can include one or more antennas defined by a closed cavity printed circuit board (PCB), such as any of those described herein. The antenna package can also include other types of antennas, such as a dipole antenna, for example.

It will be understood that various functionalities associated with transmitting and receiving of RF signals can be achieved by one or more components that are collectively represented in FIG. 1 as the transceiver 13. For example, a single component can be configured to provide both transmitting and receiving functionalities. In another example, transmitting and receiving functionalities can be provided by separate components.

In FIG. 1, one or more output signals from the transceiver 13 are depicted as being provided to the antenna 22 via one or more transmission paths 15. In the example shown, different transmission paths 15 can represent output paths associated with different bands and/or different power outputs. For instance, the two different paths shown can represent paths associated with different power outputs (e.g., low power output and high power output), and/or paths associated with different bands. The transmit paths 15 can include one or more power amplifiers 17 to aid in boosting a RF signal having a relatively low power to a higher power suitable for transmission. Although FIG. 1 illustrates a configuration using two transmission paths 15, the wireless device 11 can be adapted to include more or fewer transmission paths 15.

In FIG. 1, one or more detected signals from the antenna 22 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although FIG. 1 illustrates a configuration using four receiving paths 16, the wireless device 11 can be adapted to include more or fewer receiving paths 16.

To facilitate switching between receive and/or transmit paths, the antenna switch module 12 can be included and can be used electrically connect the antenna 22 to a selected transmit or receive path. Thus, the antenna switch module 12 can provide a number of switching functionalities associated with an operation of the wireless device 11. The antenna switch module 12 can include a multi-throw switch configured to provide functionalities associated with, for example, switching between different bands, switching between different power modes, switching between transmission and receiving modes, or some combination thereof. The antenna switch module 12 can also be configured to provide additional functionality, including filtering and/or duplexing of signals.

FIG. 1 illustrates that in certain embodiments, the control component 18 can be provided for controlling various control functionalities associated with operations of the antenna switch module 12 and/or other operating component(s). For example, the control component 18 can aid in providing control signals to the antenna switch module 12 so as to select a particular transmit or receive path.

In certain embodiments, the processor 20 can be configured to facilitate implementation of various processes on the wireless device 11. The processor 20 can be a general purpose computer, special purpose computer, or other programmable data processing apparatus. In certain implementations, the wireless device 11 can include a computer-readable memory 19, which can include computer program instructions that may be provided to and executed by the processor 20. The battery 21 can be any suitable battery for use in the wireless device 11, including, for example, a lithium-ion battery.

Printed Circuit Board Structure(s)

Disclosed herein are embodiments of integrated antenna packages or modules including a closed cavity antenna in a printed circuit board.

Figure 2:
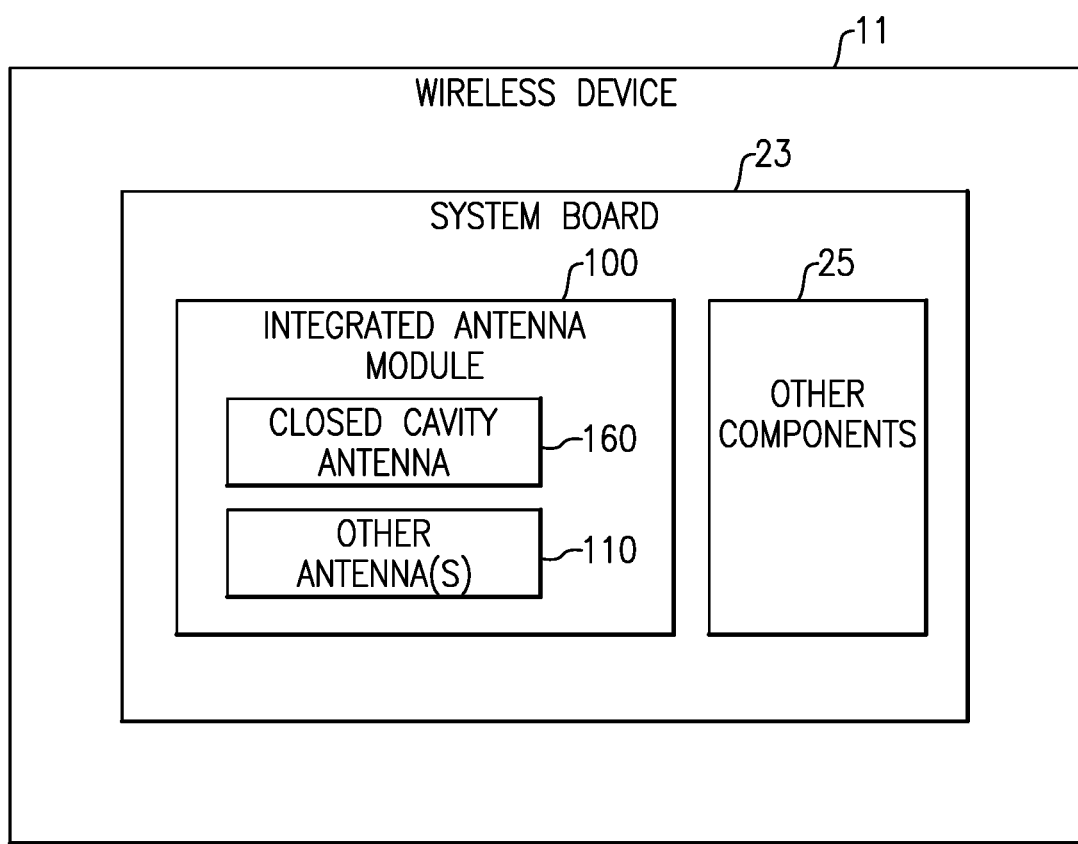
FIG. 2 is a block diagram of another example of a wireless device with an integrated antenna module.

FIG. 2 illustrates a wireless device 11 with a system board assembly 23. The system board assembly 23 can have an integrated antenna package or module 14 and other component(s) 25 disposed on the system board assembly 23 according to an embodiment. The integrated antenna package or module 14 can have one or more closed cavity antenna(s) 160 and one or more other antenna(s) 110, such as planar antennas, dipole antennas, etc. The system board 23 can be any suitable application board, such as a phone board for a mobile phone. Solder bumps of the antenna in the integrated antenna module 14 can be in physical contact with one or more ground connections of the system board 23. Accordingly, a shielding structure can surround an RF component of the antenna in an integrated antenna module 14 in three dimensions. The shielding structure can provide shielding between the RF component and the antenna layer 160 of the antenna in an integrated antenna module 14. The shielding structure can provide shielding between the RF component and one or more other components 25 disposed on the system board 23. Accordingly, the RF component can be shielded from radiation emitted by the one or more other components 25. At the same time, the other component(s) 25 can be shielded from radiation emitted from the RF component.

Figure 3:
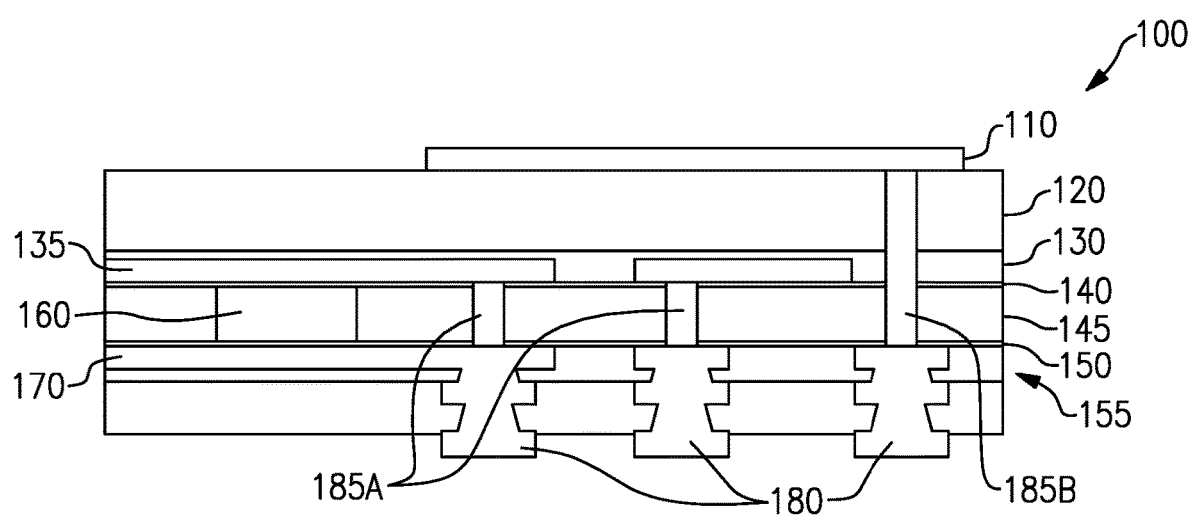
FIG. 3 is a schematic view of one embodiment of a printed circuit board structure with a closed cavity.

FIG. 3 shows one embodiment of a multi-layer printed circuit board module 100. The module 100 includes a top metal layer 110, an intermediate metal layer 135 and a bottom metal layer 170. The bottom metal layer 170 can be disposed over a substrate material 155. The intermediate metal layer 135 can be adhered by an adhesive layer 140 to a core layer 145, which can be adhered to the bottom metal layer 170 by an adhesive layer 150. The top metal layer 110 can be disposed on a core layer 120, which is attached to the intermediate metal layer 135 by an adhesive layer. The core layer 120 can be a pre-pressed layer structure having, for example, a prepreg layer disposed between copper foil layers. In some embodiments, the top metal layer 110 can be excluded. With continued reference to FIG. 3, the core layer 145 can have a cavity 160 defined therein between the adhesive layers 140, 150. In one embodiment, the cavity 160 can be a closed cavity filled with air. In another embodiment, the cavity 160 can enclose a component, or be filled with another material (e.g., high dielectric ceramics, high dielectric resonator, etc.). A pair of vias 185A can interconnect the intermediate and bottom metal layers 135, 170 and a through via 185B can interconnect the top metal layer 110 to a ground layer, for example via connectors 180.

In one embodiment, the top metal layer 110 can be a planar antenna, for example, that radiates in one direction, for example upwardly. Optionally, the cavity 160 can also be an antenna, for example, that radiates in a second direction (e.g., different than the first direction), such as laterally (to the side in FIG. 3).

Figure 4A:
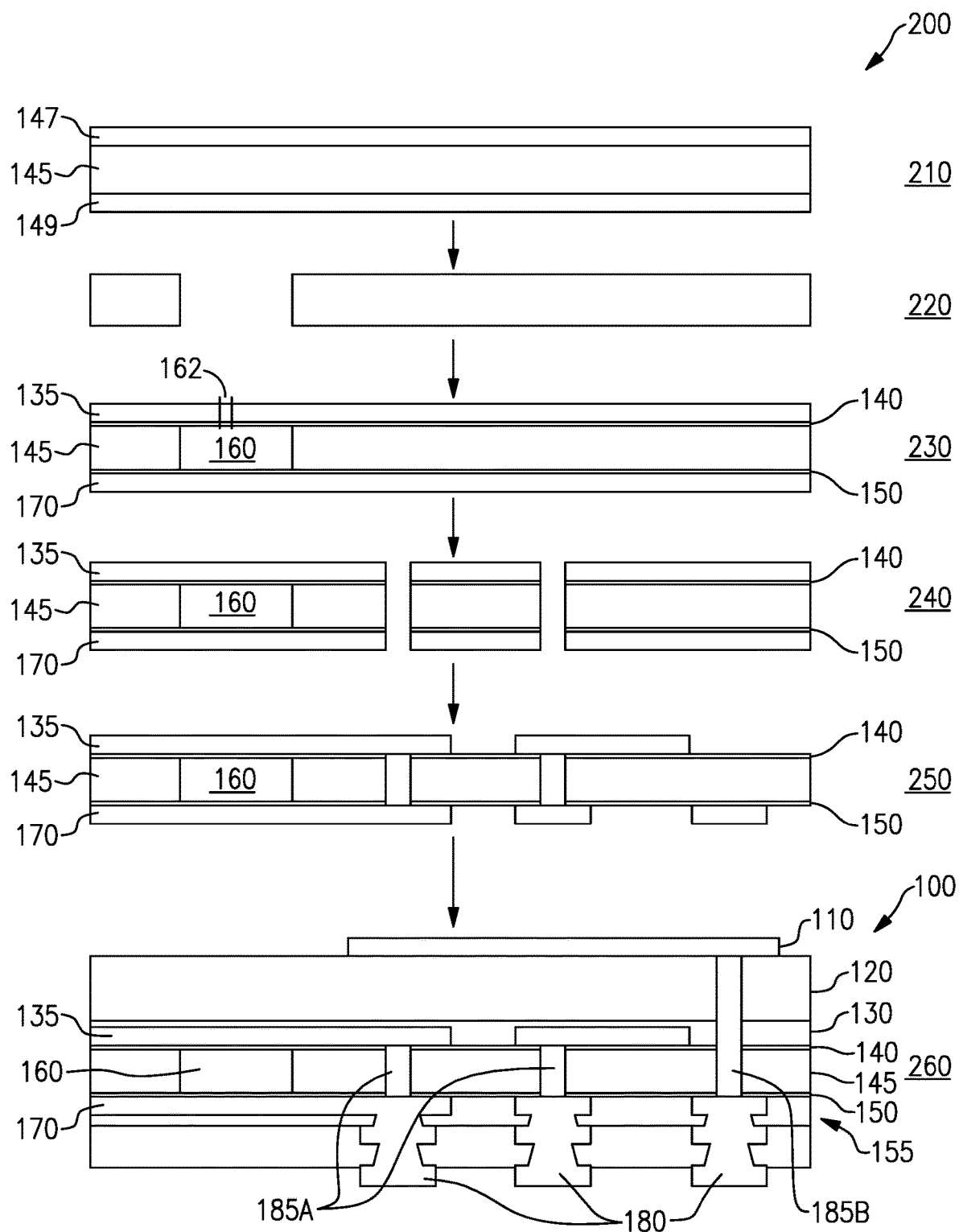
FIG. 4A is a flow diagram of a method for making the printed circuit board structure of FIG. 3.

FIG. 4A is a flow diagram of a method 200 for making the printed circuit board module 100 of FIG. 3. A core layer 145 is provided at step 210. The core layer 145 can have a metal layer (e.g., copper) 147, 149 over a top surface and a bottom surface of the core layer 145.

At step 220, the metal layers 147, 149 can be removed from the core layer 145, such as via an etching process, and a cavity 160 can be formed. Optionally, the cavity 160 can be formed by drilling (e.g., using a mechanical drill, using a laser drill) through the core layer 145. In another embodiment, the cavity 160 can be formed using a mechanical punch tool to punch the cavity 160 into the core layer 145.

At step 230, an adhesive layer 140, 150 can be disposed over the top and bottom surfaces of the core layer 145, and metal (e.g., copper, silver, etc.) layers 135, 170 can be disposed over the adhesive layer 140, 150, for example in a Resin Coated Copper (RCC) lamination process. In one embodiment, the adhesive 140, 150 can be a thin and no-flow or low-flow resin to inhibit (e.g., prevent) resin flow inside of the cavity 160. The A vent hole 162 can be formed (e.g., via drilling, such as mechanical or laser drilling) in the cavity 60 to allow air to vent from the cavity 60 when the structure is heated during the manufacturing process (e.g., lamination process), thereby inhibiting (e.g., preventing) damage to the PCB structure from expansion forces applied by the air in the cavity 160 when heated. The vent hole 162 can optionally be drilled vertically through the adhesive layer 140 and metal layer 135. In another embodiment, the vent hole 162 can optionally be drilled horizontally through the core layer 145.

At step 240, one or more vias 185A can be formed through the metal layers 135, 170, adhesive layers 140, 150 and core layer 145. The one or more vias 185A can be optionally be formed via drilling (e.g., mechanical drilling, laser drilling).

At step 250, the metal layers 135, 170 (e.g., copper layers) can be patterned by removing metal from the metal layers 135, 170 in a desired manner to provide the desired electrical connection between the metal layers 135, 170. In one embodiment, the metal layers 135, 170 can be patterned using an etching process. In other embodiments, other suitable processes (e.g., ablation) can be used for the patterning process.

At step 260, outer layers can be applied. In the illustrated embodiment, a substrate material can be disposed under the metal layer 170, and a core layer 120 and top metal layer 110 can be disposed over the metal layer 135 to define the printed circuit board module 100.

Figure 4B:
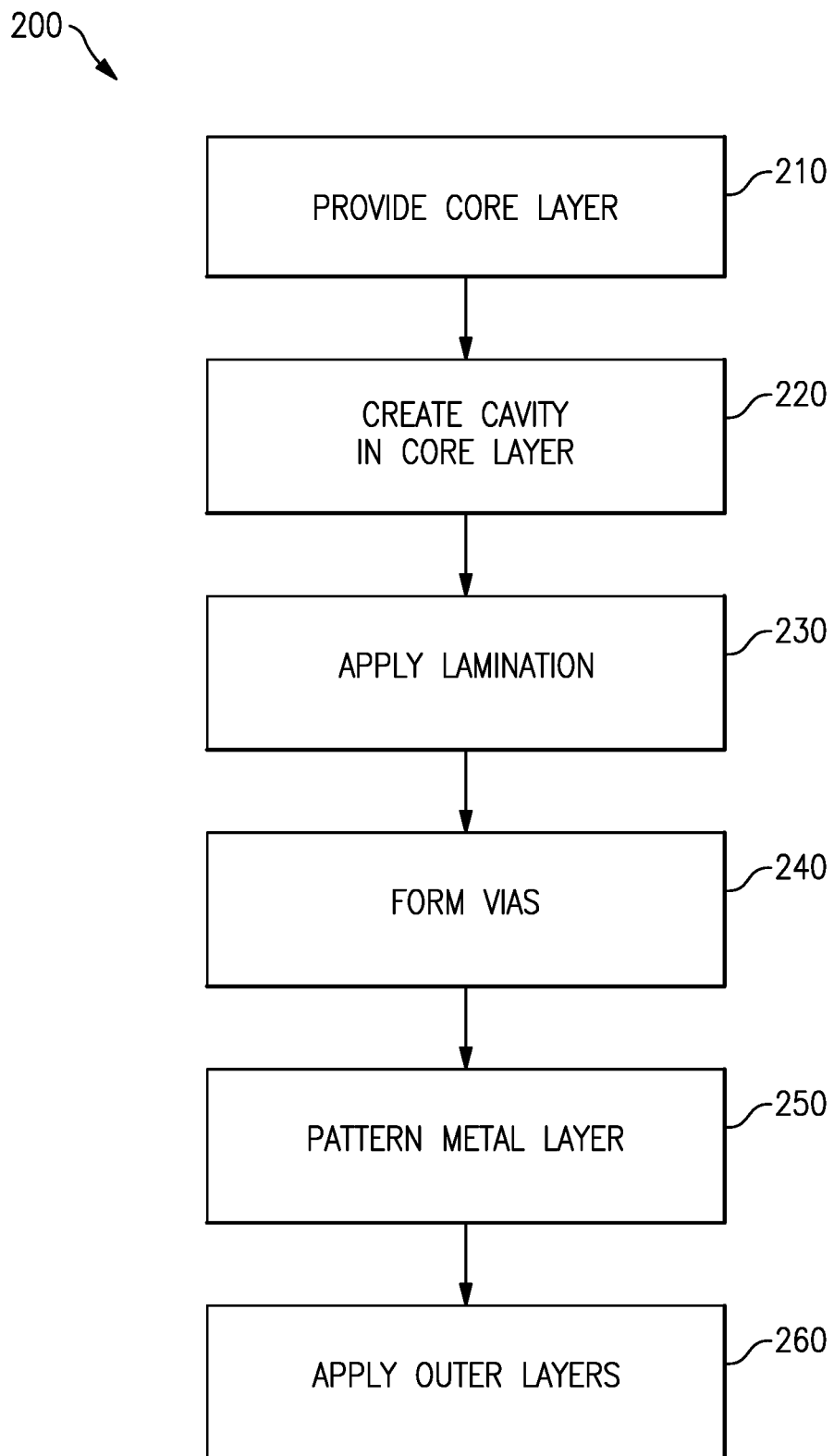
FIG. 4B is a block diagram of a method of manufacturing a printed circuit board with a closed cavity.

FIG. 4B show a block diagram of the method 200 for manufacturing the closed cavity printed circuit board 100. At block 210, the core layer 145 is provided and the top and bottom metal layer are removed from the core layer 145. At block 220, an opening is formed in the core layer 145 (e.g., by drilling through the core layer 145). At block 230, the core layer 145 is laminated (e.g., using a Resin Coated Copper process) to close the previously formed opening to define the closed cavity 160 in the core layer 145. At block 240, one or more via 185A are formed in the core layer 145. At block 250, the metal layers 135, 170 (e.g., copper layers) applied in the lamination step are patterned by removing metal from the metal layers 135, 170 in a desired manner to provide the desired electrical connection between the metal layers 135, 170. At block 260, one or more outer layers can be applied to complete the printed circuit board 100.

Figure 5:
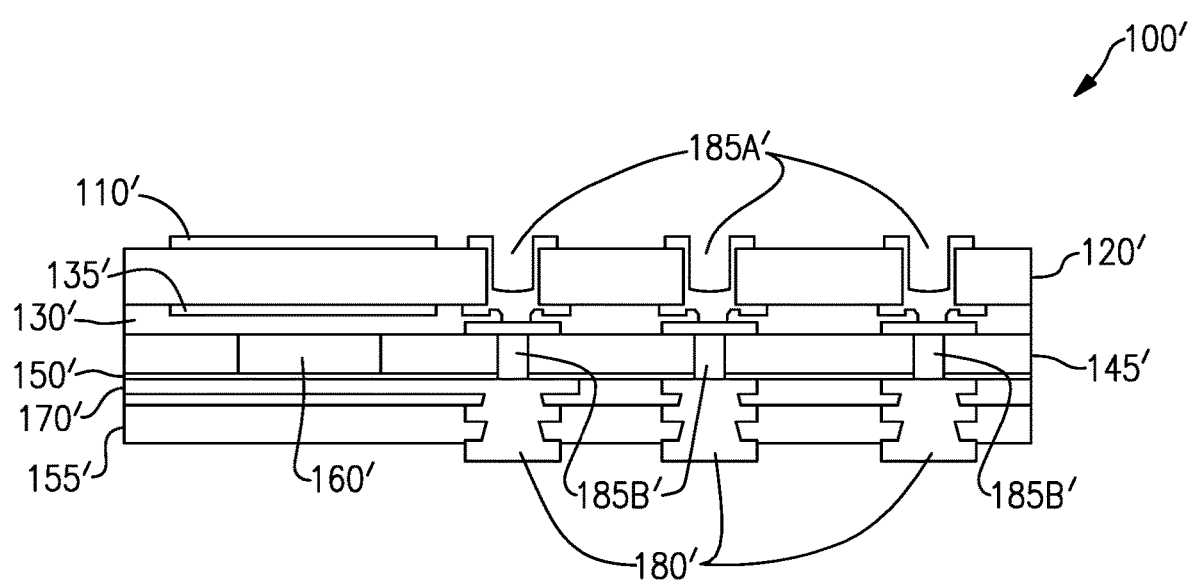
FIG. 5 is a schematic view of an embodiment of a printed circuit board structure with a closed cavity.

FIG. 5 shows another embodiment of a multi-layer printed circuit board module 100' that is similar to the printed circuit board module 100 in FIG. 3, except as described below. The printed circuit board 100' is constructed similar to the printed circuit board 100 shown in FIG. 3, except as noted below. Therefore, the references numerals used to designate the various components of the printed circuit board 100' are identical to those used for identifying the corresponding components of the printed circuit board 100 in FIG. 3, except that a "'" has been added to the reference numerals.

The module 100' includes a top metal layer 110', an intermediate metal layer 135' and a bottom metal layer 170'. The bottom metal layer 170' can be disposed over a substrate material 155'. The intermediate metal layer 135' can be adhered by an adhesive layer 140' to a core layer 145', which can be adhered to the bottom metal layer 170' by an adhesive layer 150'. The top metal layer 110' can be disposed on a core layer 120', which is attached to the intermediate metal layer 135'. In some embodiments, the top metal layer 110' can be excluded. With continued reference to FIG. 5, the core layer 145' can have a cavity 160" defined therein between the adhesive layers 140', 150'. In one embodiment, the cavity 160" can be a closed cavity filled with air. One or more vias 185A' can interconnect the intermediate and top metal layers 135', 110' and one or more vias 185B' can interconnect the intermediate and bottom metal layers 135', 170', which can connect to a ground layer, for example via connectors 180'.

In one embodiment, the top metal layer 110' can be a planar antenna, for example, that radiates in one direction, for example upwardly. Optionally, the cavity 160' can also be an antenna, for example, that radiates in a second direction (e.g., different than the first direction), such as laterally (to the side in FIG. 5).

Figure 6A:
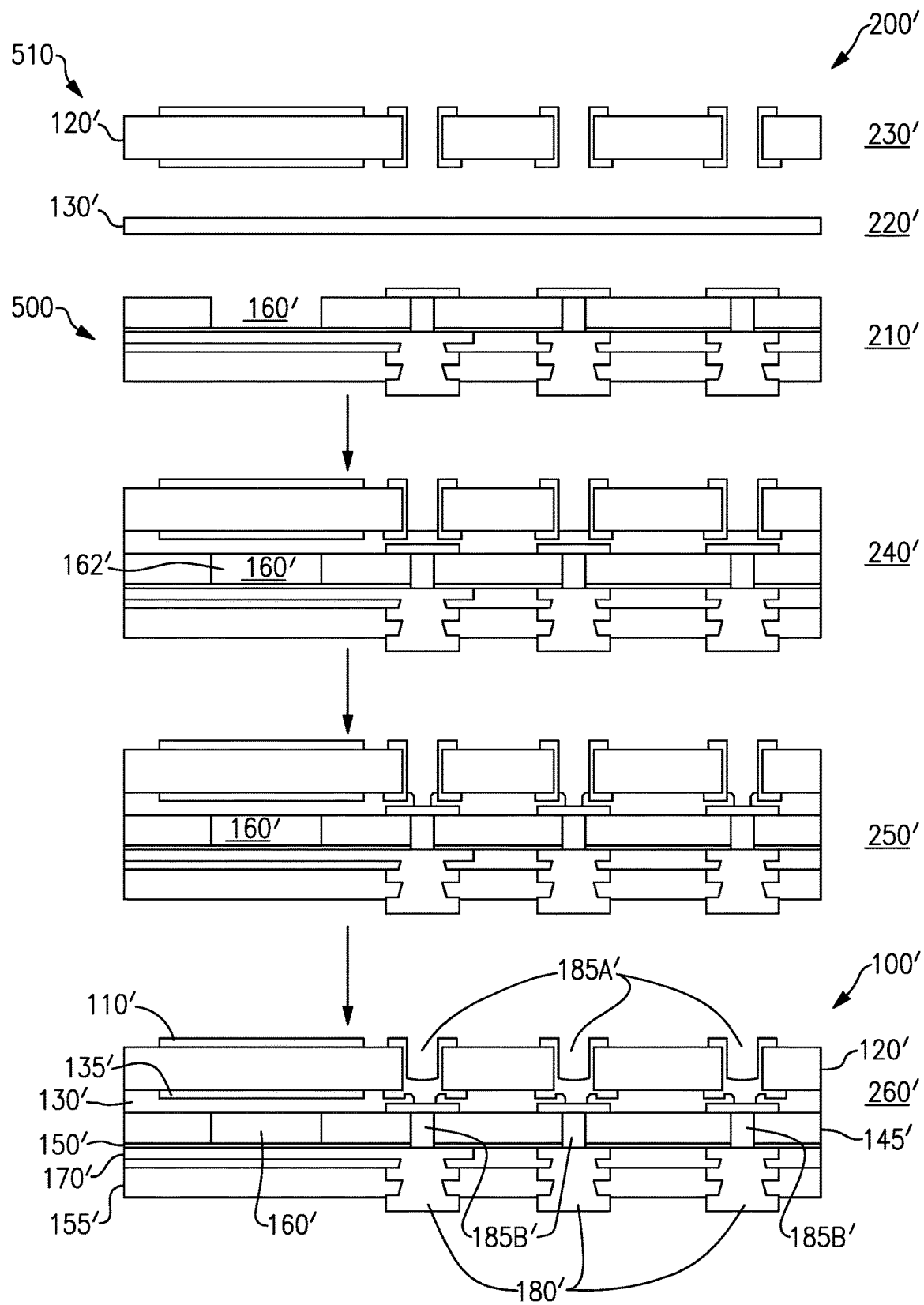
FIG. 6A is a flow diagram of a method of making the printed circuit board structure of FIG. 5.

FIG. 6A is a flow diagram of a method 200' for making the printed circuit board module 100' of FIG. 5, which is similar to the method 200 in FIG. 4A, except as described below. Therefore, the references numerals used to designate the various steps of the method 200' are identical to those used for identifying the corresponding steps of the method 200 in FIG. 4A, except that a "'" has been added to the reference numerals.

A printed circuit board structure 500 is provided that has an open cavity 160' at step 210'. The cavity 160" can be defined in a core layer 145', which can be attached over a metal layer 170' (e.g., copper) with an adhesive layer 150'. The metal layer 170' can be disposed on a substrate material 155'.

At step 220', an adhesive layer 130' is disposed over the core layer 145' to cover the exposed cavity 160". In one embodiment, the adhesive layer 130' can be a low-flow or no-flow resin material to inhibit (e.g. prevent) excessive flow of resin into the cavity 160". In another embodiment, a prepreg layer can be used instead of the adhesive layer 130' to cover the exposed cavity 160". An air vent 162' can be applied to the cavity 160" (e.g., via drilling, such as mechanical or laser drilling, as described above) in order to inhibit (e.g., prevent) damage to the cavity or PCB structure from the expansion of air in the closed cavity 160" during heating of the structure (e.g., during the manufacturing process).

At step 230', a two-layer board 510 can be provided. The two-layer board 510 can have a core layer 120' with metal layers 110', 135' on top and bottom surfaces thereof, and can have one or more vias 185A' that interconnect the metal layers 110', 135'.

At step 240', the 2-layer board can be laminated over printed circuit board structure 500 with the adhesive layer 130' in between.

At step 250', through bores 185A' can be formed, for example via laser drilling.

At step 260', plating of the bores 185A' is performed to fill at least a portion of the bores 185A' with metal to define vias 185A' that electrically connect the printed circuit board structure 500 with the two-layer board 510.

Figure 6B:
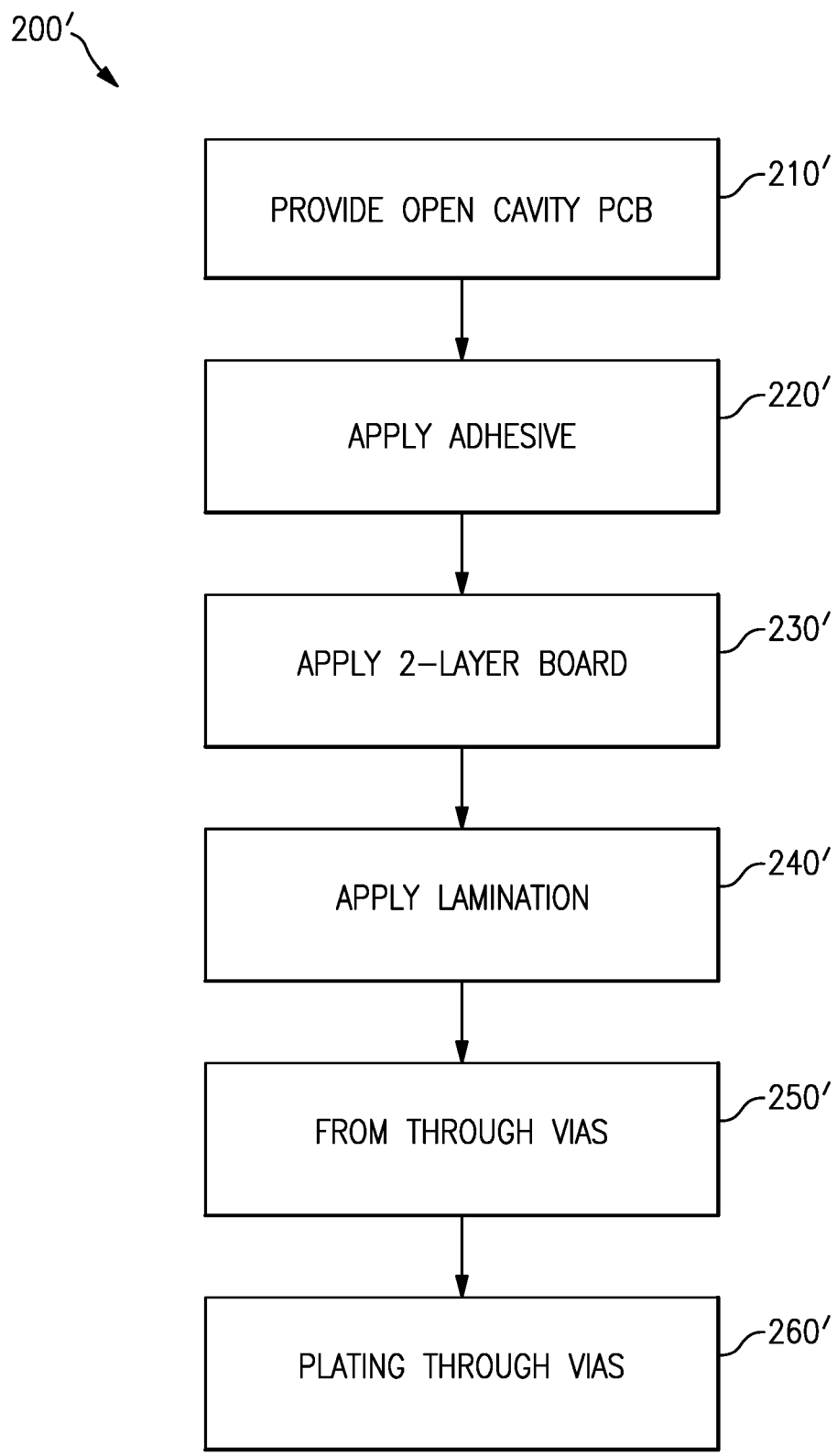
FIG. 6B is a block diagram of a method of manufacturing a printed circuit board with a closed cavity.

FIG. 6B show a block diagram of the method 200' for manufacturing the closed cavity printed circuit board 100'. At block 210', an open cavity PCB 500 is provided. At block 220', an adhesive layer 130' is applied over the open cavity PCB 500 to close the cavity 160". At block 230', a 2-layer board 510 is provided. At block 240', the 2-layer board 510 is laminated over the over the PCB 500. At block 250', bores for one or more vias 185A' 1856' are formed. At block 260, the bores are plated to define the vias 185A', 1856'.

Figure 7A:
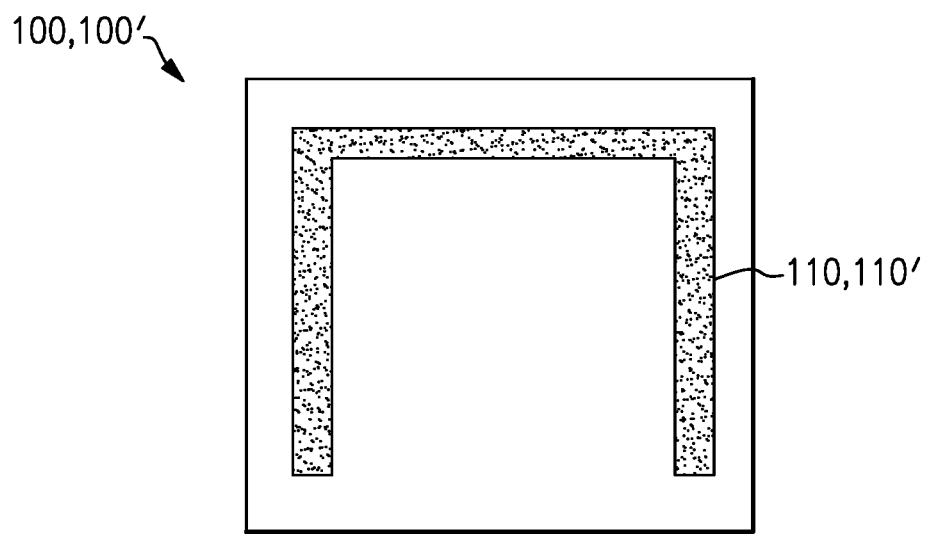
FIGS. 7A and 7B illustrate example antennas according to certain embodiments.
Figure 7B:
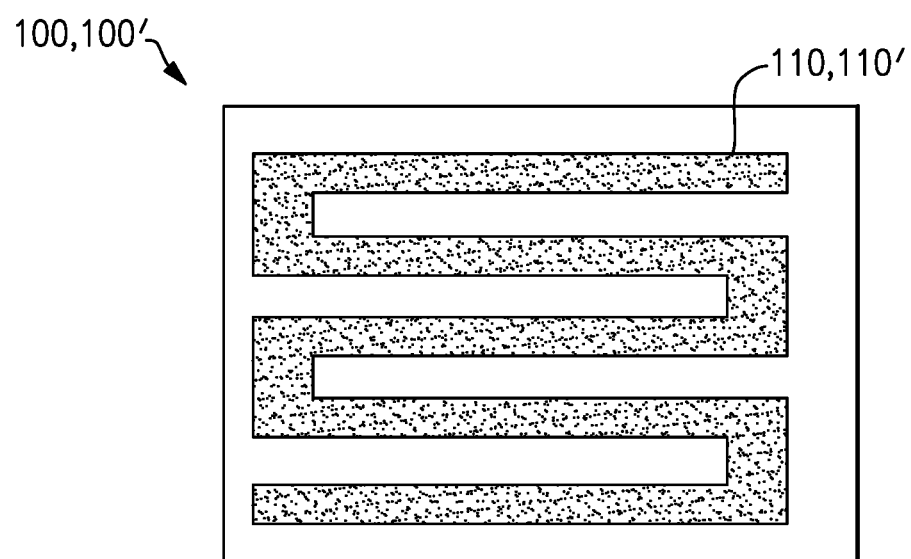

As discussed above, the top metal layers 110, 110' can be a planar antenna. The metal layers 110, 110' can include any suitable antenna shape and size. FIGS. 7A and 7B illustrate example antennas packages 100, 100' according to certain embodiments. For instance, the antenna 110, 110' can be U-shaped as shown in FIG. 7A. The antenna 110, 110' in FIG. 7A can be a folded quarter wave antenna. As another example, the antenna 110, 110' can be a meandering shape as shown in FIG. 7B. The antenna can be coil shaped in certain implementations. The antenna can be a loop antenna in some implementations. The antenna 110, 110' can serve as an antenna for a system on a chip. Such antennas can be configured to transmit and/or receive Bluetooth and/or Zig-Bee signals, for example. The antenna of the antenna layer can be in communication with transmit and/or receive circuitry by way of one or more wire bonds, by way of one or more vias extending through a substrate over which the antenna is disposed as discussed above, by way of magnetic coupling, or any combination thereof.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. For example, one portion of one of the embodiments described herein can be substituted for another portion in another embodiment described herein. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

What is claimed is:

1. A method of making a printed circuit board comprising:
    providing a printed circuit board structure having an open cavity defined in a core layer;
    laying a cover layer over the printed circuit board structure so that the cover layer extends over the open cavity to cover the open cavity and define a closed cavity antenna filled with air;
    laminating a board over the cover layer, the board having at least two layers;
    forming one or more through bores through the cover layer; and
    plating the one or more through bores to form one or more vias between a top metal layer of the board and a bottom metal layer of the board.

2. The method of claim 1 wherein the board is a 2-layer board.

3. The method of claim 1 wherein the cover layer is a prepreg layer.

4. The method of claim 1 wherein the cover layer is a no-flow or low-flow adhesive layer.

5. The method of claim 1 wherein the cover layer defines a top wall of the closed cavity.

6. The method of claim 1 wherein forming one or more through bores includes forming the bores with a laser.

7. The method of claim 1 further comprising forming a vent hole between the closed cavity and an outer edge of the printed circuit board to allow air to exit the closed cavity, thereby inhibiting damage to the closed cavity from increased pressure from air in the closed cavity during a heating process.

8. The method of claim 1 wherein the closed cavity antenna is U shaped.

9. The method of claim 1 wherein the closed cavity antenna is coil shaped.

10. The method of claim 1 wherein the closed cavity antenna is a loop antenna.

11. A closed-cavity printed circuit board comprising:
- a printed circuit board structure having an open cavity defined in a core layer;
- a cover layer over the printed circuit board structure so that the cover layer extends over the open cavity to cover the cavity and define a closed cavity antenna filled with air;
- a board over the cover layer, the board having at least two layers;
- one or more through bores through the cover layer; and
- one or more plated through bores to form one or more vias between a top metal layer of the board and a bottom metal layer of the board.

12. The closed-cavity printed circuit board of claim 11 wherein the board is a 2-layer board.

13. The closed-cavity printed circuit board of claim 11 wherein the cover layer is a prepreg layer.

14. The closed-cavity printed circuit board of claim 11 wherein the cover layer is a no-flow or low-flow adhesive layer.

15. The closed-cavity printed circuit board of claim 11 wherein the cover layer defines a top wall of the closed cavity.

16. The closed-cavity printed circuit board of claim 11 wherein forming one or more through bores includes forming the bores with a laser.

17. The closed-cavity printed circuit board of claim 11 further comprising a vent hole between the closed cavity and an outer edge of the printed circuit board to allow air to exit the closed cavity, thereby inhibiting damage to the closed cavity from increased pressure from air in the closed cavity during a heating process.

18. The closed-cavity printed circuit board of claim 11 wherein the closed cavity antenna is U shaped.

19. The closed-cavity printed circuit board of claim 11 wherein the closed cavity antenna is coil shaped.

20. The closed-cavity printed circuit board of claim 11 wherein the closed cavity antenna is a loop antenna.

* * * * *